United States Patent
Banerji et al.

(10) Patent No.: US 10,345,353 B2
(45) Date of Patent: Jul. 9, 2019

(54) FULLY DIFFERENTIAL CURRENT SENSING

(71) Applicant: TEXAS INSTRUMENTS INCORPORATED, Dallas, TX (US)

(72) Inventors: Sudeep Banerji, Manchester, NH (US); Dattatreya Baragur Suryanarayana, Bedford, NH (US); Vikram Gakhar, Bengaluru (IN); Preetam Tadeparthy, Bengaluru (IN); Vikas Lakhanpal, Bengaluru (IN); Muthusubramanian Venkateswaran, Bengaluru (IN); Vishnuvardhan Reddy J, Secunderarabad (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/810,245

(22) Filed: Nov. 13, 2017

(65) Prior Publication Data

US 2019/0146020 A1    May 16, 2019

(51) Int. Cl.
  *H02M 3/156* (2006.01)
  *G01R 31/01* (2006.01)
  *H02M 1/00* (2006.01)

(52) U.S. Cl.
  CPC .......... *G01R 31/013* (2013.01); *H02M 3/156* (2013.01); *H02M 2001/0009* (2013.01)

(58) Field of Classification Search
  CPC ...... G01R 17/16; G01R 23/09; G01R 31/333; H03F 1/04; H02M 3/156; H02M 3/158; H02M 3/1588
  See application file for complete search history.

(56) References Cited

U.S. PATENT DOCUMENTS

2009/0146643 A1*   6/2009   Ostrom ................. H02M 3/156
                                                             324/123 R \* cited by examiner

*Primary Examiner* — Adolf D Berhane
*Assistant Examiner* — Afework S Demisse
(74) *Attorney, Agent, or Firm* — Tuenlap Chan; Charles A. Brill; Frank D. Cimino

(57) ABSTRACT

A current detection system includes an inductor and a detection circuit coupled across the inductor. The inductor is configured to receive an input signal that includes an input current and generate a voltage across the inductor. The current detection circuit includes a sensing network and a transconductance amplifier. The sensing network includes a capacitor and is configured to monitor a voltage across the inductor. The transconductance amplifier is configured to receive a differential voltage indicative of a voltage drop across the capacitor and output a differential output current proportional to the differential voltage.

18 Claims, 4 Drawing Sheets

FULLY DIFFERENTIAL CURRENT SENSING

BACKGROUND

A switch-mode power supply (SMPS) is an electronic circuit that converts an input direct current (DC) supply voltage into one or more DC output voltages that are higher or lower in magnitude than the input DC supply voltage. An SMPS that generates an output voltage lower than the input voltage is termed a buck or step-down converter. An SMPS that generates an output voltage higher than the input voltage is termed a boost or step-up converter.

A typical SMPS includes a switch for alternately opening and closing a current path through an inductor in response to a switching signal. In operation, a DC voltage is applied across the inductor. Electrical energy is transferred to a load connected to the inductor by alternately opening and closing the switch as a function of the switching signal. The amount of electrical energy transferred to the load is a function of the duty cycle of the switch and the frequency of the switching signal. Switch-mode power supplies are widely used to power electronic devices, particularly battery-powered devices, such as portable cellular phones, laptop computers, and other electronic systems in which efficient use of power is desirable.

In many systems, current sensing circuits are utilized to determine how much current is being generated by the SMPS for the load and/or whether the generated current may damage any components in the load. Therefore, current sensing circuits are designed to determine the amount of current flowing through the inductor, and thus, into the load. In some examples, a current sensing circuit can generate an alert signal when the input current into the system is too high (e.g., can cause damage to the load).

SUMMARY

In accordance with at least one embodiment of the disclosure, a current detection system includes an inductor and a detection circuit coupled across the inductor. The inductor is configured to receive an input signal that includes an input current and generate a voltage across the inductor. The current detection circuit includes a sensing network and a transconductance amplifier. The sensing network includes a capacitor and is configured to monitor the voltage across the inductor. The transconductance amplifier is configured to receive a differential voltage indicative of a voltage drop across the capacitor and output a differential output current proportional to the differential voltage.

Another illustrative embodiment is a current detection circuit that includes a high side circuit coupled across an inductor and a low side circuit. The high side circuit includes a transconductance amplifier that is configured to receive a differential voltage indicative of a voltage drop across the inductor and output a differential output current proportional to the differential voltage. The differential voltage includes a first voltage and a second voltage. The differential output current includes a first output current and a second output current. The low side circuit is configured to receive the differential output current and generate a signal indicative of an input current into the filter based on the differential output current.

Yet another illustrative embodiment is a method of detecting an inductor current in a system input signal. The method includes receiving, by an inductor, the input signal. The method also includes receiving a differential voltage indicative of a voltage drop across the inductor. The method also includes outputting a differential output current proportional to the differential voltage. The method also includes generating a signal indicative of the input current based on the differential output current.

BRIEF DESCRIPTION OF THE DRAWINGS

For a detailed description of various examples, reference will now be made to the accompanying drawings in which.

NOTATION AND NOMENCLATURE

Figure 1:
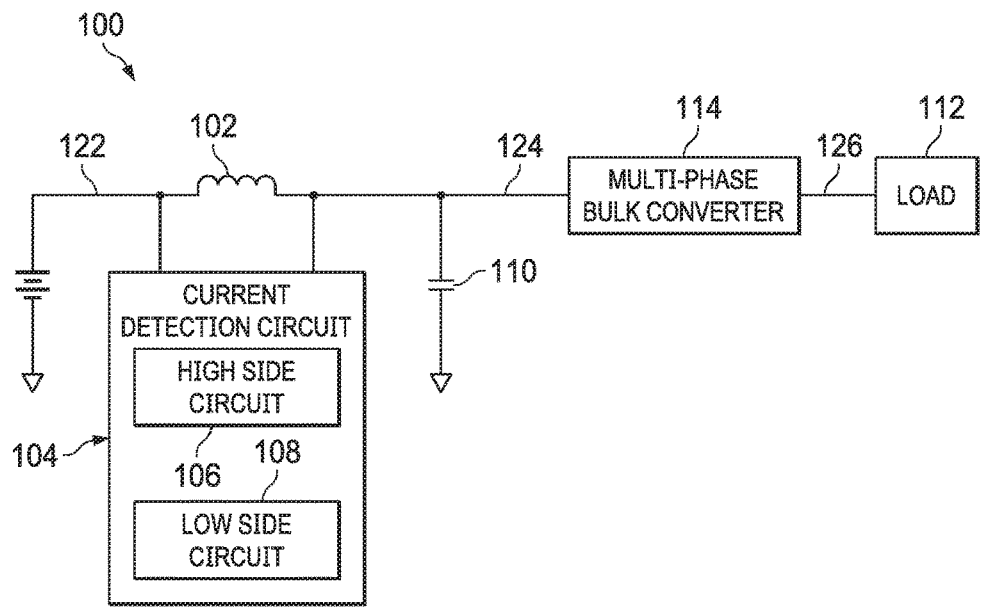
FIG. 1 shows a block diagram of an illustrative current detection system in accordance with various examples.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections. The recitation "based on" is intended to mean "based at least in part on." Therefore, if X is based on Y, X may be based on Y and any number of other factors.

DETAILED DESCRIPTION

The following discussion is directed to various embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Current sensing circuits are utilized to determine how much current is being generated or provided by a voltage source (e.g., by a SMPS) for a load and/or whether the generated current may damage any components in the load. Therefore, current sensing circuits are designed to determine the amount of current flowing through an inductor, and thus, into the load. In some examples, a current sensing circuit can generate an alert signal when the input current into the system is too high (e.g., can cause damage to the load). Current sensing circuits may also measure current flowing through inductors in any location in a circuit (e.g., input stage, output stage, etc.).

Conventional current sensing circuits sense the voltage difference across the inductor (which includes a DC resistance component). These conventional current sensing circuits utilize a single-ended feedback sense technique which is prone to transient output spikes if the input current suddenly changes because one node of the sense resistor is regulated while the other node is directly connected to the resistance component of the inductor. This transient output spike can cause a false indication of a high current. In other words, such a transient output spike can cause the conventional current sensing circuit to trigger a high input current alert when the input current is actually below the alert threshold value. Therefore, many conventional current sensing circuits require a filter in the high input current alert signal path that can remove such a spike. However, if the input signal does contain an input current above the alert threshold value, such a filter can cause the alert signal to be delayed. Furthermore, conventional current sensing circuits may require a deliberate offset to be provided to ensure that the input stage of the sense amplifier is provided the correct voltage polarity to convert the voltage difference into a proportional current. Therefore, it would be desirable for a current sensing circuit that did not require a filter to remove common mode signals in the input current alert signal path and did not require an offset.

In accordance with various examples, a current detection system is provided that improves common mode response and rejection of common mode noise. The current detection system is fully differential in the input stage and feedback (i.e., in the high side circuit of the system that senses the voltage drop across the inductor) and both nodes of the sense resistor are regulated. Because both the nodes see the same noise or common mode signals, the noise rejection is higher and the time constant requirement of the filter of the alert signal path in the output stage (i.e., in the low side circuit of the system) is much lower than conventional systems. In fact, in some embodiments, a filter is not required in the alert signal path in the output stage. Therefore, any high current alert signal is able to be generated without the delay of the conventional system that includes a high time constant filter. Moreover, because the current detection circuit is fully differential in the input stage, a specific polarity requirement is not required, unlike in conventional systems.

FIG. 1 shows a block diagram of an illustrative current detection system 100 in accordance with various examples. The current detection system 100 includes, in an embodiment, an inductor 102, a current detection circuit 104, a capacitor 110, a multi-phase buck converter 114, and a load 112. For example, a power source (e.g., a battery, an external power supply, etc.) generates an input signal 122 with an input current. The energy of the input current flow in the inductor 102 is stored as a magnetic field and released when the input signal 122 is disconnected from the power source. The capacitor 110 acts in concert with the inductor 102 to filter the output terminal voltage of the inductor 102 to generate the output voltage 124. The output voltage 124 powers, in an embodiment, a multi-phase buck converter 114. The multi-phase buck converter 114 can step down the voltage received as part of the output voltage 124 to generate a load voltage 126. For example, the multi-phase buck converter 114 can receive output voltage 124 at a relatively high voltage (e.g., 12V) and generate load voltage 126 at a relatively low voltage (e.g., 5v, 3V, etc.) to power a load 112. The load 112 may be any electric or electronic circuit.

The current detection circuit 104 is coupled across the inductor 102 and includes, in an embodiment, a high side circuit 106 and a low side circuit 108. While shown in FIG. 1 and subsequent Figures as being coupled to inductor 102 at the input of the multi-phase buck converter 114, the current detection circuit 104 can be coupled across any inductor in any location of any circuit (e.g., across an inductor at the output of the multi-phase buck converter 114 prior to the load 112). The current detection circuit 104 is configured to sense (e.g., determine) the current in the input signal 122 (the input current). The high side circuit 106 is fully differential. More particularly, the high side circuit 106 takes an indication of the differential voltage drop across the inductor 102 and generates a differential current signal that is proportional to the differential voltage drop. The low side circuit 108 receives the differential current signal and generates a signal indicative of the input current based on the differential current signal (e.g., a high input current alert signal 126 and/or the actual amount of current in the input signal 122 (signal 128)). Because the high side circuit 106 is fully differential, common mode noise rejection is high.

Figure 2:
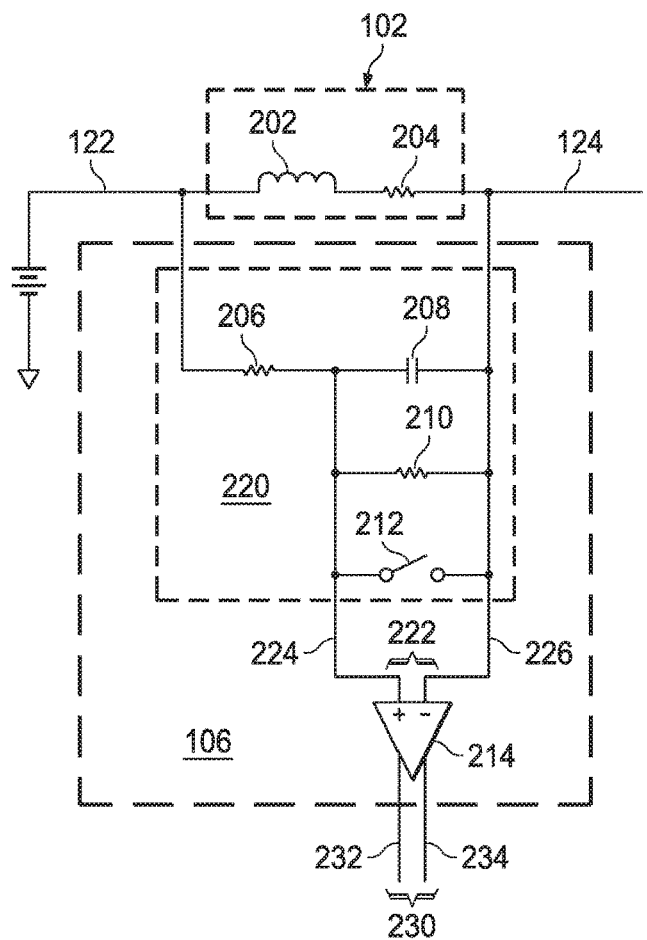
FIG. 2 shows a circuit diagram of an illustrative high side circuit of a current detection circuit in accordance with various examples.

FIG. 2 shows a circuit diagram of an illustrative high side circuit 106 of current detection circuit 104 in accordance with various examples. As shown in FIG. 2, the inductor 102 includes an inductive component 202 and a resistive component 208. Voltage drop across the inductor 102 is primarily due to the resistive component 208. The high side circuit 106 includes, in some embodiments, a sensing network 220, and a transconductance amplifier 214 (e.g., an operational transconductance amplifier (OTA)). The sensing network 220 can include a resistor 206 and a capacitor 208 in parallel with the inductor 102. The resistor 206 and capacitor 208 form a sensing network that senses the voltage drop across the inductor 102. More particularly, the resistor 206 is connected to the input terminal of the inductor while the capacitor 208 is connected to the output terminal of the inductor 102. Therefore, the voltage drop across the inductor 102 is the same as the voltage drop across the capacitor 208. In other words, the sensing network 220 is configured to monitor a voltage across the inductor 102.

In some embodiments, the sensing network 220 also includes a negative temperature coefficient (NTC) resistor 210 and switch 212. The NTC resistor 210 is a variable resistor that is configured to cancel temperature variation of the resistance component 204. For example, as temperature increases, the resistance in the resistance component 204 of inductor 102 increases. Thus, to maintain a constant resistance in the system, the NTC resistor 210 is configured to decrease as the temperature increases. The switch 212 is configured, in an embodiment, to open and close to sample voltage drop across the capacitor 208 in order to determine and cancel any offset generated by the transconductance amplifier 214.

The transconductance amplifier 214 is configured to receive the differential voltage 222 indicative of the voltage drop across the capacitor 208, which in turn is indicative of the voltage drop across inductor 102. More particularly, the positive input of the transconductance amplifier 214 is connected to a first terminal of the capacitor 208 while the negative input of the transconductance amplifier 214 is connected to a second terminal of the capacitor 208. Because the transconductance amplifier 214 is fully differential, the negative input can be connected to either terminal of the capacitor 208 with the positive input of the transconductance amplifier 214 being connected to the other terminal. Hence, the differential voltage 222 is the difference in voltage between the first voltage 224 and the second voltage 226.

The transconductance amplifier 214 is also configured to generate and output a differential output current 230 that is proportional to the differential voltage 222. The transconductance amplifier 214, in an embodiment, includes a sense resistor and at least two transconductance loops (transconductance loop circuits). In such embodiments, the transconductance amplifier 214 converts the voltage drop across the sense resistor into output differential current 230 that includes two symmetrical currents (the first output current 232 and the second output current 234). In other words, the transconductance amplifier 214 converts the voltage drop across the sense resistor into a positive current (the first output current 232) and a negative current (the second output current 234) each of which has the same magnitude (i.e., the first output current 232 is equal in magnitude to the second output current 234). Thus, as the differential voltage 222 increases (the difference between the first voltage 224 and the second voltage 226 increases), the first output current 232 increases and the second output 234 decreases symmetrically. In this way, the high side circuit 106 is fully differential and thus, provides high common mode noise rejection.

Figure 3A:
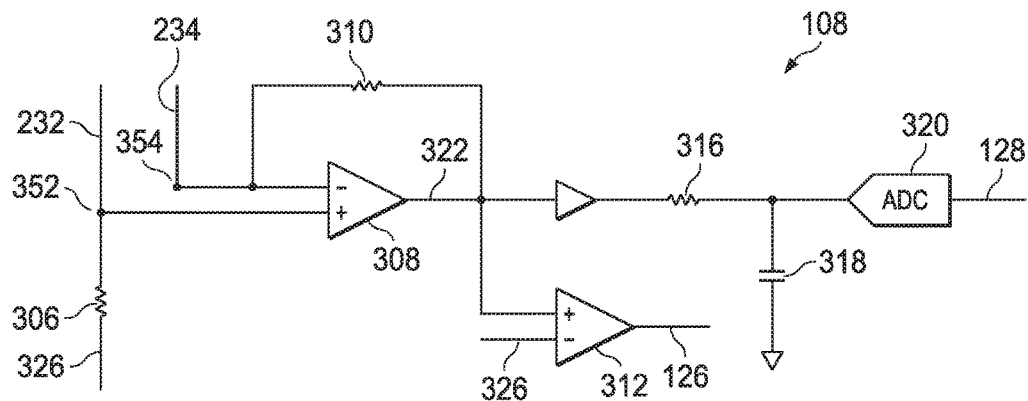
FIG. 3A shows a circuit diagram of an illustrative low side circuit of a current detection circuit in accordance with various examples.

FIG. 3A shows a circuit diagram of illustrative low side circuit 108 of current detection circuit 104 in accordance with various examples. The low side circuit 108, as shown in FIG. 3A, includes, in some embodiments, the operational amplifier 308, resistors 306, 310, 316, comparator 312, capacitor 318, and analog-to-digital converter (ADC) 320. The amplifier 308, in some embodiments, receives the differential output current 230, both the first output current 232 and the second output current 234, from the high side circuit 106 and generates a single-ended amplified voltage 322 from the differential output current 230. For example, the voltage at node 352 is equal to $V_{326}+(I-\Delta I)*R_{306}$, where $V_{326}$ is the voltage reference 326, $I-\Delta I$ is the first output current 232 and $R_{306}$ is the resistance of resistor 306. Similarly, the voltage at node 354 is equal to $V_{322}+(I+\Delta I)*R_{310}$, where $V_{322}$ is the single-ended amplified voltage 322, $I+\Delta I$ is the second output current 234 and $R_{310}$ is the resistance of resistor 310. In some embodiments, the resistance of resistor 310 is equal to the resistance of resistor 306. Thus, the single-ended amplified voltage 322 can be defined as $V_{322}=V_{326}-2\Delta I*R_{310}$, where $\Delta I$ is the output differential current 230. In some embodiments, the amplifier 308 amplifies the voltage at nodes 352 and 354 from 0-100 mV 0.5-1.7V through resistors 306 and 310.

Comparator 312 is, in an embodiment, configured to receive the single-ended amplified voltage 322 and reference voltage 326. The reference voltage 326 corresponds with a threshold value of the input current (e.g., a predetermined and/or programmable value). In some embodiments, the threshold value is based on the current that, when exceeded, causes damage to any of the electronic components of the load 112. If the single-ended amplified voltage 322 is greater than the reference voltage 326, the comparator 312 generates an alert signal 126 that indicates that the input current is greater than the threshold value. However, if the single-ended amplified voltage 322 is not greater than the reference voltage 326, the comparator 312 does not generate an alert signal 126 and/or generates a signal that indicates that the input current is not greater than the threshold value. Because common mode noise is reduced due to the fully differential nature of the high side circuit 106, a filter is not required to filter the single-ended amplified voltage 322 or a very small filter may be used (e.g., a filter with a relatively low time constant). Therefore, the time needed to detect whether the input current is greater than the threshold value can be reduced when compared to conventional architectures. In other words, any alert signal generated by the input current detection circuit 104 is generated with relatively (when compared to the conventional system) delay.

The single-ended amplified voltage 322 can also be received by the ADC 320. In some embodiments, the resistor 316 and capacitor 318 act to filter the single-ended amplified voltage 322 prior to the single-ended amplified voltage 322 being received by the ADC 320. The ADC 320 is configured to generate a digital output signal 128 that is indicative of the input current. More particularly, the ADC 320 can be configured to generate a digital output signal 128 that is proportional to the input current.

Figure 3B:
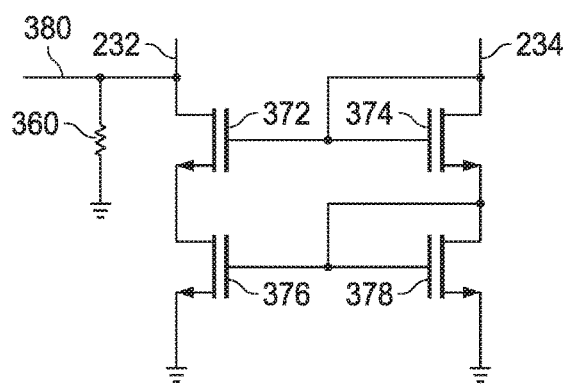
FIG. 3B shows a circuit diagram of an illustrative low side circuit of a current detection circuit in accordance with various examples.

FIG. 3B shows a circuit diagram of illustrative low side circuit 108 of current detection circuit 104 in accordance with various examples. The low side circuit 108, as shown in FIG. 3B, includes, in some embodiments, transistors 372-378 and resistor 360. In some embodiments, the each of the transistors 372-378 are n-channel metal-oxide-semiconductor field-effect (NMOS) transistors. However, the transistors 352-358 can be any type of transistor including p-channel metal-oxide-semiconductor field-effect (PMOS) transistors and/or bipolar junction transistors (BJTs). The low side circuit 108 receives the first output current 232 and second output current 234 (differential current 230) from the high side circuit 106. The low side circuit 108, utilizes the transistors 372-378 and resistor 360 to generate an output voltage 380 that is proportional to the current through the inductor 102.

Figure 4:
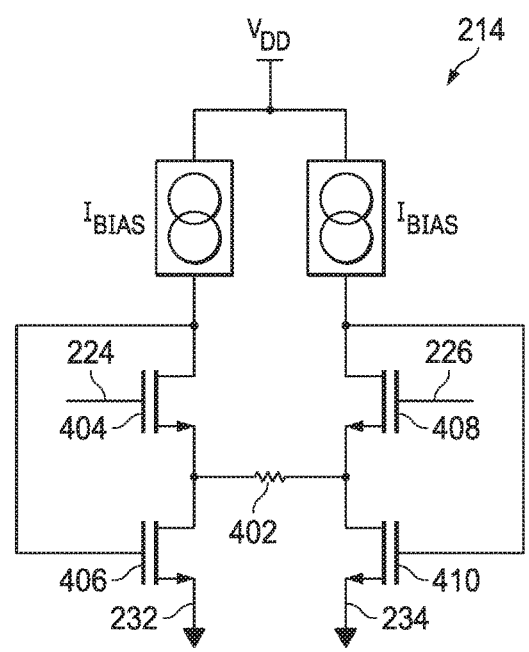
FIG. 4 shows a circuit diagram of an illustrative transconductance amplifier of a current detection circuit in accordance with various examples.

FIG. 4 shows a circuit diagram of an illustrative transconductance amplifier 214 of current detection circuit 104 in accordance with various examples. As discussed above, the transconductance amplifier 214 can include two transconductance loop circuits as shown in FIG. 4. The transconductance loop circuits include, in an embodiment, transistors 404-410, and sense resistor 402. The transistors 404-410 are, in an embodiment, NMOS transistors. However, the transistors 404-410 can be any type of transistor including PMOS transistors and/or BJTs.

In some embodiments, the gate of transistor 404 is configured to receive the first voltage 224 while the gate of transistor 408 is configured to receive the second voltage 226. However, because the high side circuit 106 is fully differential, the gate of transistor 404 can receive either the first voltage 224 or the second voltage 226 while the gate of transistor 408 receives the other of the first voltage 224 or the second voltage 226. The source of transistor 404 is connected to the drain of transistor 406 while the drain of transistor 404 is connected to the gate of transistor 406. The source of transistor 408 is connected to the drain of transistor 410 while the drain of transistor 408 is connected to the gate of transistor 410. The sense resistor 402 is connected to the source of the first transistor 404, the drain of the transistor 406, the source of transistor 408, and the drain of transistor 410.

Because the first voltage 224 and second voltage 226 are received, in an embodiment, directly from the capacitor 208, there is no single-ended conversion of the differential voltage 230 and there is no processing of the differential voltage 230 prior to being received by the transconductance amplifier 214. If the first voltage 224 is greater than the second voltage 226, the difference in voltage is reflected onto the sense resistor 402, hence, allowing the sense resistor 402 to measure the voltage drop across the capacitor 208 and thus, the inductor 102. Whatever noise is in the first voltage 224 and second voltage 226 translates at the same time onto the sense resistor 402. The current through the sense resistor 402 is then output as first output current 232 and second output current 234. In other words, the current through sense resistor 402 is dependent and proportional to the input current. Thus, the differential current 230 is generated directly from reading the differential voltage 222. In summary, the transconductance amplifier 302 shown in FIG. 4 allows a difference in voltage across capacitor 208 to be translated into a difference in current.

Figure 5:
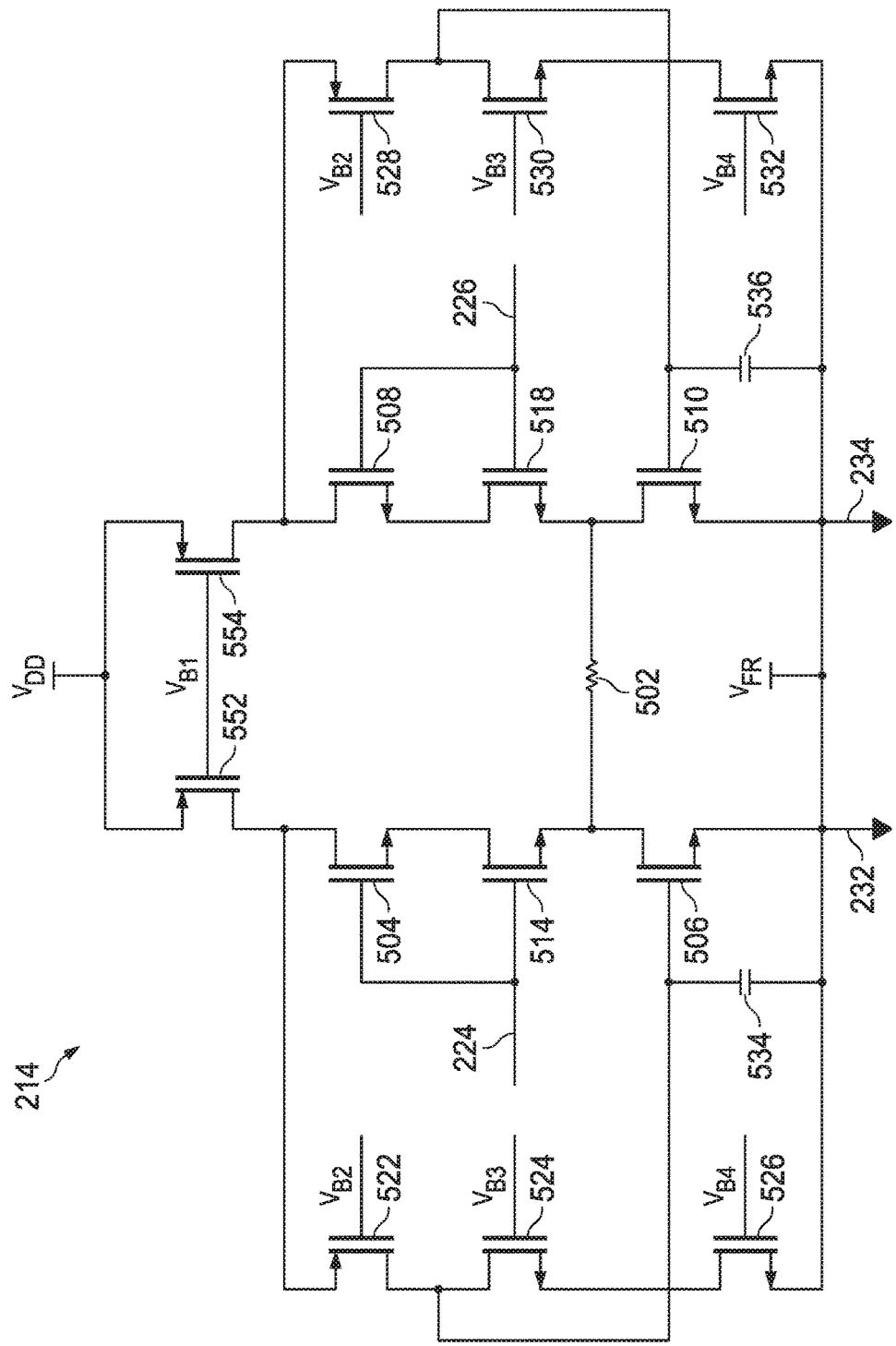
FIG. 5 shows a circuit diagram of an illustrative transconductance amplifier of a current detection circuit in accordance with various examples.

FIG. 5 shows a circuit diagram of an illustrative transconductance amplifier 214 of current detection circuit 104 in accordance with various examples. The transconductance amplifier 214 shown in FIG. 5 is similar to the transconductance amplifier shown in FIG. 4 and operates in a similar manner. However, the transconductance amplifier 214 shown in FIG. 5 includes a cascoded stage that enables a larger increase in gain in the differential voltage 222 and reduces channel length modulation effects of the input devices. Thus, the transconductance amplifier 214 shown in FIG. 5 includes, in an embodiment, the sense resistor 502, the transistors 504-532 and the capacitors 534-536. Similar to transistors 404-410, the transistors 504-532 are, in an embodiment, NMOS transistors; however, in alternative embodiments, the transistors 504-532 can be any type of transistor including PMOS transistors and/or BJTs. This architecture allows the transconductance amplifier 214 to generate the first output current 232 and the second output current 234.

Figure 6:
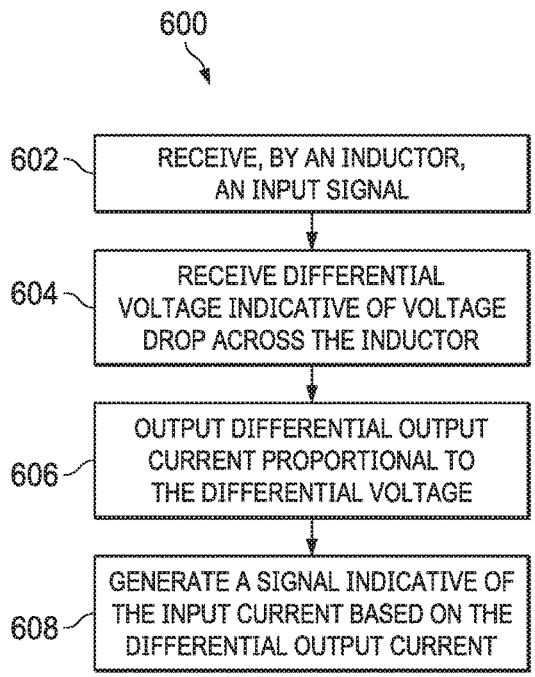
FIG. 6 shows an illustrative flow diagram of a method of detecting an inductor current in a system input signal in accordance with various examples.

FIG. 6 shows an illustrative flow diagram of a method 600 of detecting an inductor current in a system input signal in accordance with various examples. Though depicted sequentially as a matter of convenience, at least some of the actions shown can be performed in a different order and/or performed in parallel. Additionally, some embodiments may perform only some of the actions shown. In some embodiments, at least some of the operations of the method 600, as well as other operations described herein, are performed by the inductor 102, the high side circuit 106 of the current detection circuit 104 (including the resistor 206, the capacitor 208, the NTC resistor 210, the switch 212, and/or the transconductance amplifier 214), and/or the low side circuit 108 of the current detection circuit 104 (including the amplifier 308, the resistors 306, 310, 316, the comparator 312, the capacitor 318, and/or the ADC 320), and implemented in logic.

The method 600 begins in block 602 with receiving, by an inductor, an input signal. For example, the inductor 102 can be configured to receive the input signal 122 from a voltage source or any other source. The input signal 122 includes an input current. In block 604, the method 600 continues with receiving a differential voltage indicative of a voltage drop across the inductor. For example, the transconductance amplifier 214 can receive the differential voltage 222 from across the capacitor 208. The differential voltage across capacitor 208 is indicative of the voltage across the inductor 102; therefore, the differential voltage 222 is also indicative of the voltage across the inductor 102.

The method 600 continues in block 606 with outputting a differential output current that is proportional to the differential voltage. For example, the transconductance amplifier 214 can generate the differential output current 230 from the current through sense resistor 402 and/or 502 which is proportional to the differential voltage 222. In block 608, the method 600 includes generating a signal indicative of the input current based on the differential output current.

Figure 7:
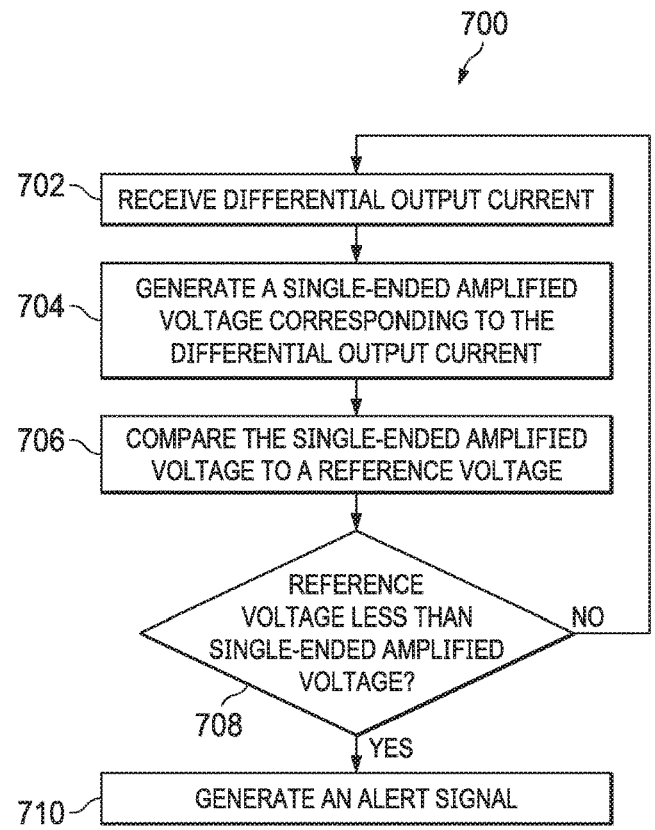
FIG. 7 shows an illustrative flow diagram of a method for generating a signal indicative of an input current in accordance with various examples.

FIG. 7 shows an illustrative flow diagram of a method 700 of generating a signal indicative of an input current in accordance with various examples. Though depicted sequentially as a matter of convenience, at least some of the actions shown can be performed in a different order and/or performed in parallel. Additionally, some embodiments may perform only some of the actions shown. In some embodiments, at least some of the operations of the method 700, as well as other operations described herein, are performed by the inductor 102, the high side circuit 106 of the current detection circuit 104 (including the resistor 206, the capacitor 208, the NTC resistor 210, the switch 212, and/or the transconductance amplifier 214), and/or the low side circuit 108 of the current detection circuit 104 (including the amplifier 308, the resistors 306, 310, 316, the comparator 312, the capacitor 318, and/or the ADC 320), and implemented in logic.

The method 700 begins in block 702 with receiving a differential output current. For example, the amplifier 308 can receive the differential output current 230 from the high side circuit 106. In block 704, the method 700 continues with generating a single-ended amplified voltage corresponding to the differential output current. For example, the amplifier 308 can generate single-ended amplified voltage 322.

The method 700 continues in block 706 with comparing the single ended amplified voltage to a reference voltage. For example, the comparator 312 can compare the single-ended amplified voltage 322 with the reference voltage 326. In block 708, the method 700 continues with determining whether the reference voltage is less than the single-ended voltage. If in block 708, a determination is made that the reference voltage is less than the single-ended voltage, then the method 700 continues in block 710 with generating an alert signal. For example, the comparator 312 can generate alert signal 126 if the comparator 312 determines that the reference voltage 326 is less than the single-ended voltage 322. However, if, in block 708, a determination is made that the reference voltage is not less than the single-ended voltage, then the method 700 continues in block 702 with receiving a differential output current.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:
1. A current detection system, comprising:
  an inductor configured to receive an input signal that includes an input current and generate a voltage across the inductor; and
  a current detection circuit coupled across the inductor, the current detection circuit including:
    a sensing network configured to monitor the voltage across the inductor, the sensing network including a capacitor; and
    a transconductance amplifier configured to receive a differential voltage indicative of a voltage drop across the capacitor and output a differential output current proportional to the differential voltage, wherein:
the differential output current includes a first output current and a second output current; and
the transconductance amplifier is configured to increase the first output current and decrease the second output current as the differential voltage increases.

2. The current detection system of claim 1, wherein the capacitor is in parallel with the inductor and a first terminal of the capacitor is connected to a negative input of the transconductance amplifier and a second terminal of the capacitor connected to a positive input of the transconductance amplifier.

3. The current detection system of claim 2, wherein the transconductance amplifier includes a transconductance loop circuit.

4. The current detection system of claim 3, wherein the transconductance amplifier includes a cascoded stage to increase gain of the differential voltage.

5. The current detection system of claim 1, wherein the current detection circuit further includes a low side circuit configured to receive the differential output current and, in response to the input current being greater than a threshold value, generate an alert signal.

6. The current detection system of claim 5, wherein the low side circuit includes:
an operational amplifier configured to receive the differential output current and generate a single-ended amplified voltage from the differential output current; and
a comparator configured to receive the single-ended amplified voltage, compare the single-ended amplified voltage to a reference voltage, and generate the alert signal in response to the single-ended amplified voltage being greater than the reference voltage,
wherein the reference voltage corresponds with the threshold value.

7. The current detection circuit of claim 6, wherein the comparator is configured to receive the single-ended amplified voltage directly from the operational amplifier without the single-ended amplified voltage being filtered.

8. The current detection circuit system of claim 1, wherein the current detection circuit further includes a low side circuit configured to receive the differential output current and generate a signal indicative of the input current based on the differential output current, the low side circuit including:
an operational amplifier configured to receive the differential output current and generate a single-ended amplified voltage from the differential output current; and
an analog-to-digital converter (ADC) configured to receive the single-ended amplified voltage and generate a digital output signal proportional to the input current.

9. A current detection circuit, comprising
a high side circuit coupled across an inductor, the high side circuit including:
a transconductance amplifier configured to receive a differential voltage indicative of a voltage drop across the inductor and output a differential output current proportional to the differential voltage, the differential voltage including a first voltage and a second voltage and the differential output current including a first output current and a second output current; and
a low side circuit configured to receive the differential output current and generate a signal indicative of an input current into the filter based on the differential output current.

10. The current detection circuit of claim 9, wherein the transconductance amplifier includes a transconductance loop circuit.

11. The current detection circuit of claim 10, wherein the transconductance loop circuit includes a cascoded input stage.

12. The current detection circuit of claim 9, wherein the transconductance amplifier includes:
a first transistor comprising a first drain, a first gate, and a first source, the first gate configured to receive the first voltage;
a second transistor comprising a second drain, a second gate, and a second source, the second gate configured to receive the second voltage;
a third transistor comprising a third drain, a third gate, and a third source, the third drain connected to the first source and the third source generating the first output current; and
a fourth transistor comprising a fourth drain, a fourth gate, and a fourth source, the fourth drain connected to the second source and the fourth source generating the second output current.

13. The current detection circuit of claim 12, wherein the transconductance amplifier further includes a sense resistor connected to the first source, the second source, the third drain, and the fourth drain.

14. The current detection circuit of claim 9, wherein the low side circuit includes an operational amplifier configured to receive the first output current and the second output current and generate a single-ended amplified voltage.

15. The current detection circuit of claim 14, wherein the low side circuit further includes a comparator configured to receive the single-ended amplified voltage, compare the single-ended amplified voltage to a reference voltage, and generate an alert signal that indicates that the input current is greater than a threshold value in response to the single-ended amplified voltage being greater than the reference voltage, the reference voltage corresponding with the threshold value.

16. The current detection circuit of claim 15, wherein the comparator is configured to receive the single-ended amplified voltage directly from the operational amplifier without the single-ended amplified voltage being filtered.

17. A method of detecting an inductor current in a system input signal, comprising:
receiving, by an inductor, the input signal; and
receiving a differential voltage indicative of a voltage drop across the inductor;
outputting a differential output current proportional to the differential voltage; and
generating a signal indicative of the input current based on the differential output current,
wherein generating a signal indicative of the input current includes:
receiving the differential output current;
generating a single-ended amplified voltage corresponding to the output current;
comparing the single-ended amplified voltage to a reference voltage; and
in response to the single-ended amplified voltage being greater than the reference voltage, generating an alert signal that indicates that the input current is greater than a threshold value.

18. The method of claim 17, wherein the single-ended amplified voltage is compared with the reference voltage without being filtered.

* * * * *